United States Patent
Iwao

(10) Patent No.: US 11,996,268 B2
(45) Date of Patent: May 28, 2024

(54) PLASMA PROCESSING APPARATUS AND PLASMA PROCESSING METHOD

(71) Applicant: Tokyo Electron Limited, Tokyo (JP)

(72) Inventor: Toshihiko Iwao, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 539 days.

(21) Appl. No.: 17/277,536

(22) PCT Filed: Sep. 19, 2019

(86) PCT No.: PCT/JP2019/036799
§ 371 (c)(1),
(2) Date: Mar. 18, 2021

(87) PCT Pub. No.: WO2020/066843
PCT Pub. Date: Apr. 2, 2020

(65) Prior Publication Data
US 2021/0351004 A1    Nov. 11, 2021

(30) Foreign Application Priority Data

Sep. 26, 2018  (JP) .................... 2018-180909

(51) Int. Cl.
*H01J 37/32*    (2006.01)
*C23C 16/34*    (2006.01)
(Continued)

(52) U.S. Cl.
CPC ...... *H01J 37/32082* (2013.01); *C23C 16/345* (2013.01); *C23C 16/45565* (2013.01);
(Continued)

(58) Field of Classification Search
CPC ......... H01J 37/32082; H01J 2237/3321; H01J 37/32229; H01J 37/32238;
(Continued)

(56) References Cited

U.S. PATENT DOCUMENTS 6,106,678 A * 8/2000 Shufflebotham ...... C23C 16/402
257/E21.546
6,184,158 B1 * 2/2001 Shufflebotham ...... C23C 16/402
257/E21.279
(Continued)

FOREIGN PATENT DOCUMENTS

JP    3787297 B2    3/2006

OTHER PUBLICATIONS

JP10158847, Aoki et al, Plasma Generating Apparatus published Jun. 16, 1998. (Year: 1998).*
(Continued)

*Primary Examiner* — Jethro M. Pence
(74) *Attorney, Agent, or Firm* — Armstrong Teasdale LLP

(57) ABSTRACT

A plasma processing apparatus for processing a workpiece with plasma includes a stage configured to place thereon the workpiece, a waveguide part configured to introduce plasma-generating electromagnetic waves in a VHF band into the plasma processing apparatus, and a dielectric window configured to transmit the electromagnetic waves introduced through the waveguide part to a plasma processing space formed on a workpiece placement side of the stage. The dielectric window is an annular member disposed so as to face a plasma processing space side of the stage and includes multiple convex portions, which protrude toward the stage and are arranged on the stage side along a circumferential direction at regular intervals. The convex portions each has a circumferential width of ⅛ to ⅜ of the wavelength of the electromagnetic waves inside the dielectric window.

7 Claims, 5 Drawing Sheets

(51) Int. Cl.
  *C23C 16/455* (2006.01)
  *C23C 16/458* (2006.01)
  *C23C 16/509* (2006.01)
  *H01L 21/02* (2006.01)

(52) U.S. Cl.
  CPC ........ C23C 16/4582 (2013.01); C23C 16/509 (2013.01); H01L 21/0217 (2013.01); H01L 21/02274 (2013.01); *H01J 2237/3321* (2013.01)

(58) Field of Classification Search
  CPC ........ H01J 37/32715; H01J 2237/3341; C23C 16/345; C23C 16/45565; C23C 16/4582; C23C 16/509; C23C 16/511; H01L 21/02315; H01L 21/0234; H01L 21/0217; H01L 21/02274; H01L 21/3065; H01L 21/31; H01L 21/67069; H05H 1/46
  USPC .............................................. 118/723, 723 I
  See application file for complete search history.

(56) References Cited

U.S. PATENT DOCUMENTS

| | | | | |
|---|---|---|---|---|
| 8,955,456 | B2* | 2/2015 | Cullen | H01J 37/32238 |
| | | | | 427/575 |
| 8,967,082 | B2* | 3/2015 | Iwasaki | H01L 21/02274 |
| | | | | 156/345.33 |
| 9,117,764 | B2* | 8/2015 | Matsuoka | H01L 21/31122 |
| 9,123,661 | B2* | 9/2015 | Kellogg | H01J 37/32623 |
| 10,513,777 | B2* | 12/2019 | Iwasaki | C23C 16/45548 |
| 10,593,783 | B2* | 3/2020 | Takino | H01L 21/31138 |
| 10,651,044 | B2* | 5/2020 | Nakaya | H01L 21/31116 |
| 10,734,198 | B2* | 8/2020 | Brandon | C23C 16/458 |
| 11,011,386 | B2* | 5/2021 | Shimizu | H01L 21/31116 |
| 11,699,614 | B2* | 7/2023 | Nakaya | H01L 21/67017 |
| | | | | 438/780 |
| 2001/0019903 | A1* | 9/2001 | Shufflebotham | H01J 37/321 |
| | | | | 257/E21.279 |
| 2008/0035058 | A1* | 2/2008 | Tian | H05H 1/46 |
| | | | | 118/723 AN |
| 2008/0050292 | A1* | 2/2008 | Godyak | H01J 37/321 |
| | | | | 422/186.29 |
| 2008/0050537 | A1* | 2/2008 | Godyak | H01J 37/321 |
| | | | | 427/575 |
| 2011/0057562 | A1* | 3/2011 | Chen | H01J 37/3222 |
| | | | | 315/39 |
| 2013/0065398 | A1* | 3/2013 | Ohsawa | H01J 37/32238 |
| | | | | 438/714 |
| 2015/0325448 | A1* | 11/2015 | Matsuoka | G03F 7/0752 |
| | | | | 257/618 |
| 2015/0364322 | A1* | 12/2015 | Kellogg | H01L 21/31116 |
| | | | | 118/723 R |
| 2021/0166940 | A1* | 6/2021 | Nozawa | H01L 23/562 |
| 2022/0270853 | A1* | 8/2022 | Lee | H01J 37/3244 |

OTHER PUBLICATIONS

JP2007109670, Nobuo et al, Plasma Processing Device published Apr. 26, 2007. (Year: 2007).*
WO2016/098582, Hirano et al, Plasma Treatment Device published Jun. 23, 2016. (Year: 2016).*

* cited by examiner

Small　　　　　　　　　　　　　　　　　Large

PLASMA PROCESSING APPARATUS AND PLASMA PROCESSING METHOD

CROSS-REFERENCE TO RELATED APPLICATIONS

This application is a National Stage Application of International Patent Application No. PCT/JP2019/036799, having an International Filing Date of Sep. 19, 2019, which claims the benefit of priority to Japanese Patent Application No. 2018-180909, filed Sep. 26, 2018, the entire contents of each of which are hereby incorporated by reference herein.

TECHNICAL FIELD

The present disclosure relates to a plasma processing apparatus and a plasma processing method.

BACKGROUND

Patent Document 1 discloses a plasma processing apparatus, which transmits microwaves into a vacuum chamber via a waveguide so as to generate plasma inside the vacuum chamber. This plasma processing apparatus includes a ceiling plate and a dielectric material. In the ceiling plate, a slit is provided on a portion of the vacuum chamber facing the waveguide so as to introduce microwaves into the vacuum chamber. The microwaves, which have passed through the slit, propagate along the inner surface to the surface on the vacuum chamber side. In addition, the dielectric material is a plate-shaped member, which is provided on the vacuum chamber side of the ceiling plate and transmits microwaves. The surface of the dielectric material on the vacuum chamber side has uneven portions including protrusions, wherein the uneven portions are periodically formed at a pitch of 7.5 to 30 mm.

PRIOR ART DOCUMENTS

Patent Documents

Japanese Patent No. 3787297

The technique according to the present disclosure makes a plasma distribution uniform in plasma processing by plasma generated using electromagnetic waves in a VHF (Very High Frequency) band.

SUMMARY

An aspect of the present disclosure is a plasma processing apparatus for processing a workpiece with plasma. The plasma processing apparatus includes: a stage configured to place thereon the workpiece; a waveguide part configured to introduce plasma-generating electromagnetic waves in a VHF band into the plasma processing apparatus; and a dielectric window configured to transmit the electromagnetic waves introduced through the waveguide part to a plasma processing space formed on a workpiece placement side of the stage. The dielectric window is an annular member disposed so as to face a plasma processing space side of the stage and includes multiple convex portions, which protrude toward the stage and are arranged on the stage side along a circumferential direction at regular intervals. The convex portions each has a circumferential width of 1/8 to 3/8 of the wavelength of the electromagnetic waves inside the dielectric window.

According to the present disclosure, it is possible to make a plasma distribution uniform in plasma processing performed using plasma generated using electromagnetic waves in the VHF band.

DETAILED DESCRIPTION

Figure 1:
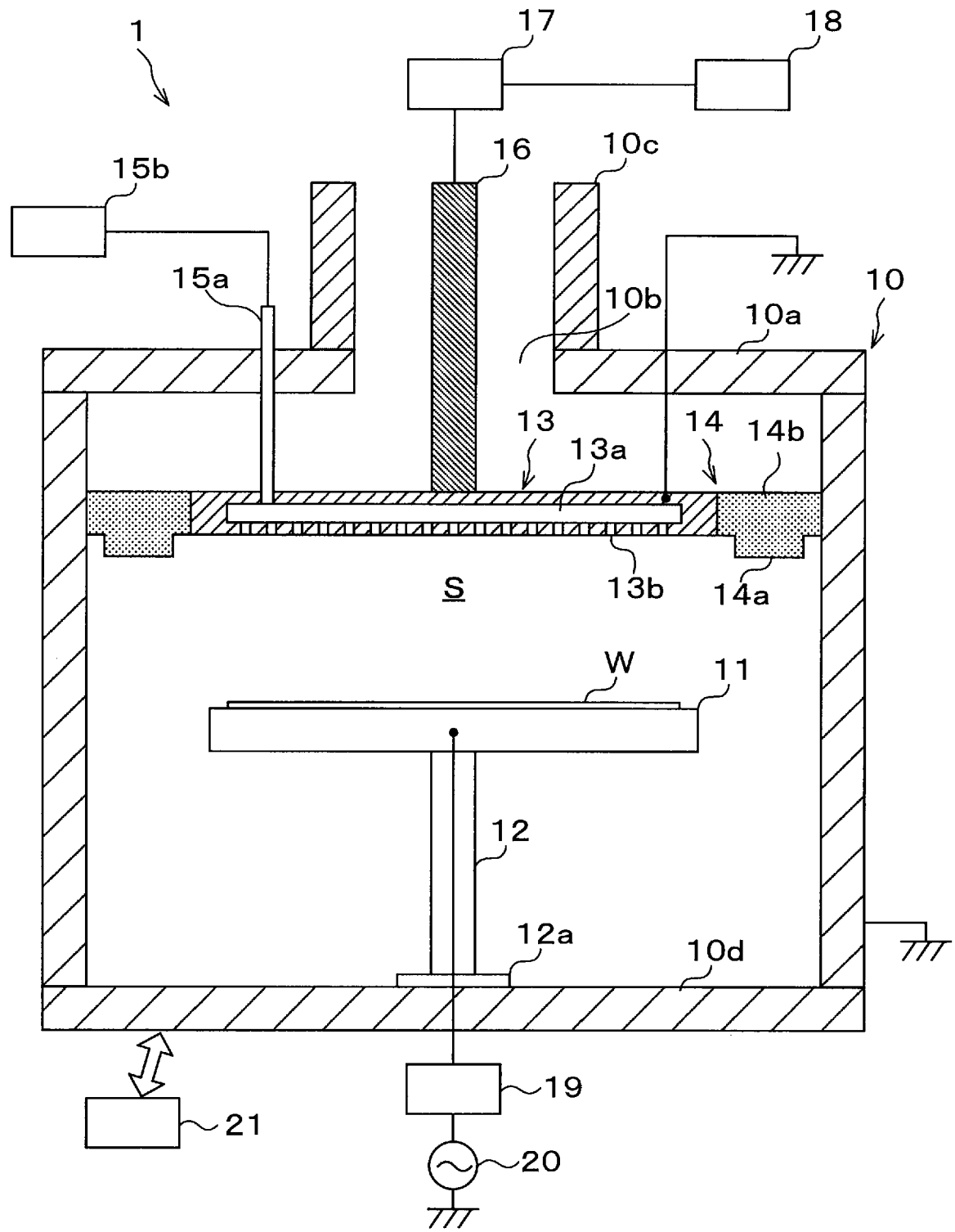
FIG. 1 is a vertical cross-sectional view schematically illustrating the configuration of a plasma processing apparatus according to a present embodiment.

In the related art, there is known a plasma processing apparatus, which performs plasma processing such as film formation or etching on a workpiece such as a semiconductor wafer (hereinafter, referred to as a "wafer").

In the plasma processing apparatus of Patent Document 1, microwaves are used to generate plasma, and the plate-shaped dielectric material, which transmits microwaves to the vacuum chamber, has uneven portions including protrusions on the surface at the vacuum chamber side. The uneven portions are periodically formed at a pitch of 7.5 mm to 30 mm. In this plasma processing apparatus, the plasma distribution is maintained constant by providing the periodic uneven portions.

Electromagnetic waves in the VHF band (hereinafter referred to as VHF waves) may be used for plasma generation instead of microwaves. In this case, according to the earnest investigation performed by the present inventor, a plasma distribution may be biased in the circumferential direction depending on the intensity of electromagnetic waves and the pressure in the vacuum chamber in which the plasma is generated, and thus the plasma distribution may not be uniform.

Patent Document 1 makes no disclosure or suggestion in this regard.

Therefore, the technique according to the present disclosure makes a plasma distribution uniform in plasma processing performed using plasma generated using VHF waves.

Hereinafter, the configuration of a plasma processing apparatus according to this embodiment will be described with reference to the drawings. In this specification, elements having substantially the same functional configurations will be denoted by the same reference numerals, and redundant descriptions will be omitted.

FIG. 1 is a vertical cross-sectional view illustrating the schematic configuration of the plasma processing apparatus 1 according to the present embodiment.

The plasma processing apparatus 1 in the figure performs plasma processing on a wafer W as a workpiece. In the plasma processing apparatus 1, plasma used for plasma processing is generated by VHF waves. In addition, the plasma processing performed by the plasma processing apparatus 1 includes, for example, film formation, etching, and doping.

The plasma processing apparatus 1 includes a substantially cylindrical processing container 10 having a plasma processing space S formed therein. The processing container 10 is made of a metal material such as aluminum, and the inner wall surface thereof is covered with a liner (not illustrated) having a sprayed coating made of a plasma-resistant material. The processing container 10 is grounded. A through hole 10b is provided in the center of the ceiling wall 10a of the processing container 10, and a tubular wall 10c, the internal cavity of which communicates with the through hole 10b, is connected to the top surface of the ceiling wall 10a. Although not illustrated, the processing container 10 includes, for example, in the bottom wall 10d thereof, an exhaust port configured to discharge the atmosphere in the processing container 10, specifically, the atmosphere in the plasma processing space S. By exhausting from the exhaust port, it is possible to decompress the plasma processing space S to a predetermined degree of vacuum.

In the lower portion of the plasma processing space S in the processing container 10, a stage 11 as a stage on which the wafer W is placed is provided.

The stage 11 is supported by a support member 12, which is vertically provided in the center of the bottom portion of the processing container 10 via an insulating member 12a. Although not illustrated, the stage 11 includes, for example, a temperature control mechanism, a gas flow path configured to supply a heat transfer gas to the rear surface of a wafer W, and lifting pins configured to move up and down so as to transmit and receive a wafer W to and from a transport arm (not illustrated). In addition, the stage 11 may be provided with an electrostatic chuck for electrostatically attracting a wafer W.

In the upper portion of the plasma processing space S above the stage 11 in the processing container 10, a shower head electrode 13 made of a metal such as aluminum and a dielectric window 14 are provided so as to face the stage 11.

The shower head electrode 13 is supported in the processing container 10 via the dielectric window 14, and a gas diffusion chamber 13a, which is substantially disk-shaped, is provided inside the shower head electrode 13. A plurality of gas supply ports 13b communicating with the gas diffusion chamber 13a are provided in the lower portion of the shower head electrode 13, that is, the portion at the plasma processing space S side. In addition, a gas supply pipe 15a is connected to the gas diffusion chamber 13a, and a gas supply source 15b is connected to the gas supply pipe 15a. A plasma processing gas supplied from the gas supply source 15b is supplied to the gas diffusion chamber 13a through the gas supply pipe 15a. The plasma processing gas supplied to the gas diffusion chamber 13a is supplied to the plasma processing space S through the gas supply port 13b.

An antenna conductor 16 is connected to the center of the top surface of the shower head electrode 13. The antenna conductor 16 is provided through the through hole 10b in the ceiling wall 10a and the center of the tubular wall 10c, and electrically connected to the VHF generation source 18 via a matcher 17. The VHF generation source 18 outputs electromagnetic waves in the VHF band (30 MHz to 300 MHz).

The electromagnetic waves from the VHF generation source 18 sequentially propagate between the outer peripheral surface of the antenna conductor 16 and the inner peripheral surface of the tubular wall 10c, between the outer peripheral surface of the antenna conductor 16 and the surface forming the through hole 10b, and between the inner surface of the ceiling wall 10a and the top surface of the shower head electrode 13, and reach the dielectric window 14. In other words, a waveguide part configured to introduce VHF waves into the plasma processing apparatus 1 includes, for example, the outer peripheral surface of the antenna conductor 16, the inner peripheral surface of the tubular wall 10c, the surface forming the through hole 10b, the inner surface of the ceiling wall 10a, and the top surface of the shower head electrode 13. The above-mentioned waveguide part may be filled with a dielectric material, such as quartz, such that electromagnetic waves can easily propagate.

The dielectric window 14 is provided so as to face the plasma processing space S side of the stage 11 and to cover the outer peripheral surface of the shower head electrode 13. The dielectric window 14 transmits the VHF waves, which have been transmitted thereto as described above, to the plasma processing space S. The dielectric window 14 includes, on the stage 11 side, that is, on the bottom side thereof, multiple convex portions 14a protruding toward the stage 11, that is, downward. Details of the dielectric window 14 and the convex portions 14a will be described later.

In the plasma processing apparatus 1, plasma is generated in the plasma processing space S by the VHF waves transmitted through the dielectric window 14. In order to draw, for example, the ions in the plasma, into a wafer W, a radio-frequency power supply 20 for RF bias is electrically connected to the stage 11 via a matcher 19. The radio-frequency power supply 20 for RF bias outputs radio-frequency power having a frequency of, for example, 400 kHz to 20 MHz. In addition, the shower head electrode 13 is grounded. The matcher 19 and the radio-frequency power supply 20 for RF bias may not be provided depending on the characteristics of plasma processing.

The substrate processing apparatus 1 is also provided with a controller 21. The controller 21 is configured with, for example, a computer including a CPU, a memory, and the like, and includes a program storage (not illustrated). The program storage stores programs for controlling the VHF generation source 18 and the like for various processes in the plasma processing apparatus 1. The programs may be recorded in a computer-readable storage medium, and may be installed in the controller 21 from the storage medium.

Figure 2:
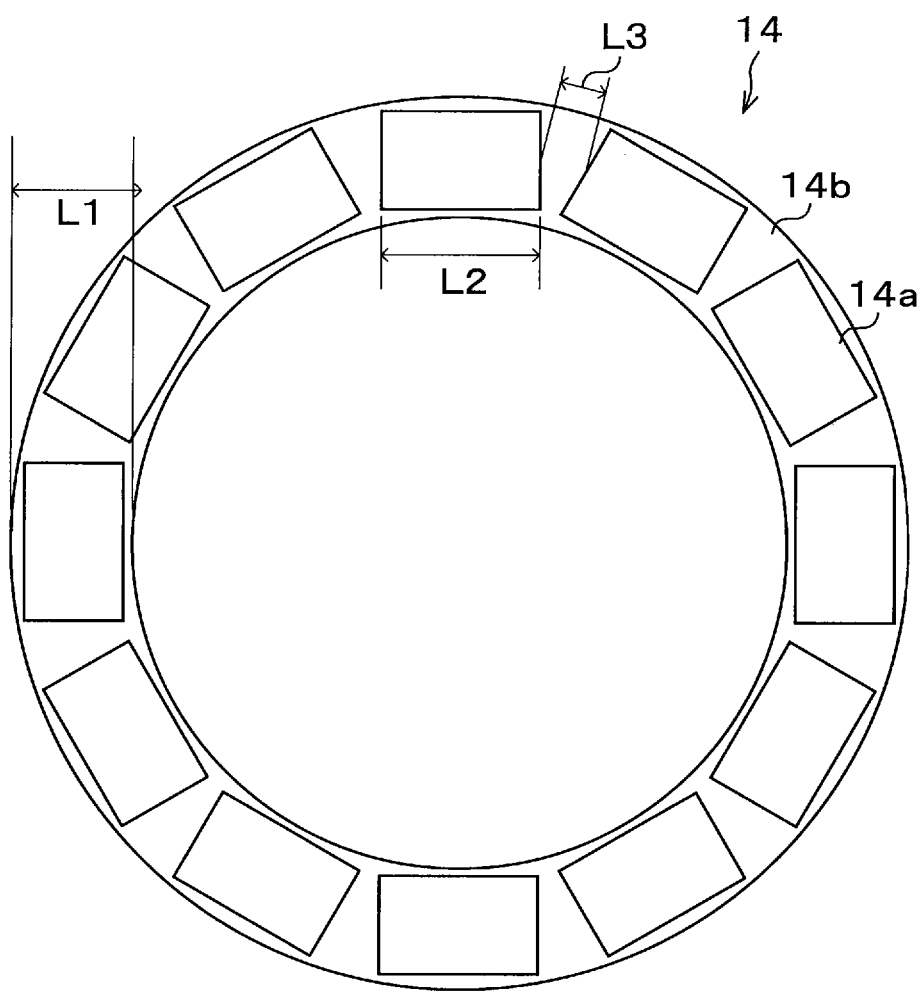
FIG. 2 is a bottom view illustrating a dielectric window.

Subsequently, the dielectric window 14 will be described with reference to FIG. 2. FIG. 2 is a bottom view of the dielectric window 14.

As illustrated in the figure, the dielectric window 14 is an annular member. The dielectric window 14 is provided so as to be located outside a wafer W so as not to overlap the wafer W on the stage 11 in a plan view. Therefore, when the outer diameter of the wafer W is 300 mm, the inner diameter of the dielectric window 14 is, for example, 300 mm or more and 450 mm or less. In this case, the radial width L1 of the dielectric window 14 is, for example, 40 mm or more and 60 mm or less, and the outer diameter of the dielectric window 14 is, for example, 350 mm or more and 500 mm or less.

The top side of the dielectric window 14 is formed flat, but as described above, the multiple convex portions 14a protruding downward are formed on the bottom side of the dielectric window 14. These convex portions 14a are arranged at regular intervals along the circumferential direction, and have a rectangular shape in, for example, both a plan view and a cross-sectional view. The convex portions 14a each has a width L2 in the circumferential direction of ⅛ to ⅜ of the wavelength λ of the VHF waves inside the dielectric window 14 such that the VHF waves from the VHF generation source 18 resonate in the convex portions 14a and electric fields are concentrated on the convex portions 14a and directly below the convex portions 14a. In this example, the "circumferential direction" means a direction perpendicular to the radial direction of the dielectric window 14. In this example, since the long sides of the rectangular shape of the convex portions 14a in the plan view are perpendicular to the radial direction of the dielectric window 14, the "width of the convex portions 14a in the circumferential direction" is the length of the longer sides of the rectangular shape. In this example, the radial width of the convex portions 14a means the length of the short sides of the rectangular shape, and is substantially the same as the radial width L1 of the dielectric window 14.

In addition, the distance L3 between adjacent convex portions 14a may be set to 1% or more of the wavelength λ of the VHF waves inside the dielectric window 14 (which may be briefly referred to as a "wavelength λ of VHF waves inside dielectric" below). As a result, the electric fields can be concentrated on each convex portion 14a and directly below each convex portion 14a.

The convex portions 14a are integrally molded with the annular main body 14b of the dielectric window 14. The thickness of the main body 14b is, for example, 10 mm to 12 mm. The dielectric window 14 is made of a material having a high dielectric constant and easy to mold, for example, alumina, quartz, or aluminum nitride.

Next, plasma processing in the plasma processing apparatus 1 will be described.

First, a wafer W is carried into the processing container 10 and placed on the stage 11. Then, the inside of the processing container 10 is evacuated by an exhaust apparatus (not illustrated), and the pressure in the plasma processing space S is adjusted to a predetermined pressure.

Thereafter, a plasma processing gas is supplied from the gas supply source 15b to the plasma processing space S via the gas diffusion chamber 13a in the shower head electrode 13 at a predetermined flow rate. As the plasma processing gas, an excitation gas, such as Ar gas, is supplied. When the plasma processing performed by the plasma processing apparatus 1 is plasma CVD processing and a SiN film is formed, nitrogen gas or silane gas is supplied as the plasma processing gas, in addition to the above-mentioned excitation gas.

Subsequently, the radio-frequency power supply 20 for RF bias supplies radio-frequency power for RF bias to the stage 11. In addition, VHF waves are transmitted from the VHF generation source 18 to the dielectric window 14 via a waveguide part formed by, for example, the space between the antenna conductor 16 and the processing container 10, and are supplied to the plasma processing space S through the dielectric window 14 having the convex portions 14a. In the plasma generated by the electric fields generated by the VHF waves transmitted through the dielectric window 14 having the convex portions 14a, circumferential bias is suppressed as will be described later.

Then, plasma processing is performed on the wafer W by radicals or the like generated by the plasma in which the circumferential bias is suppressed.

When the plasma processing is completed, the supply of the plasma processing gas, the supply of the radio-frequency power from the radio-frequency power supply 20, and the supply of the VHF waves from the VHF generation source 18 are stopped. Thereafter, the wafer W is carried out from the processing container 10, and a series of processes related to plasma processing are completed.

Here, the effects of the present embodiment will be described.

Figure 3:
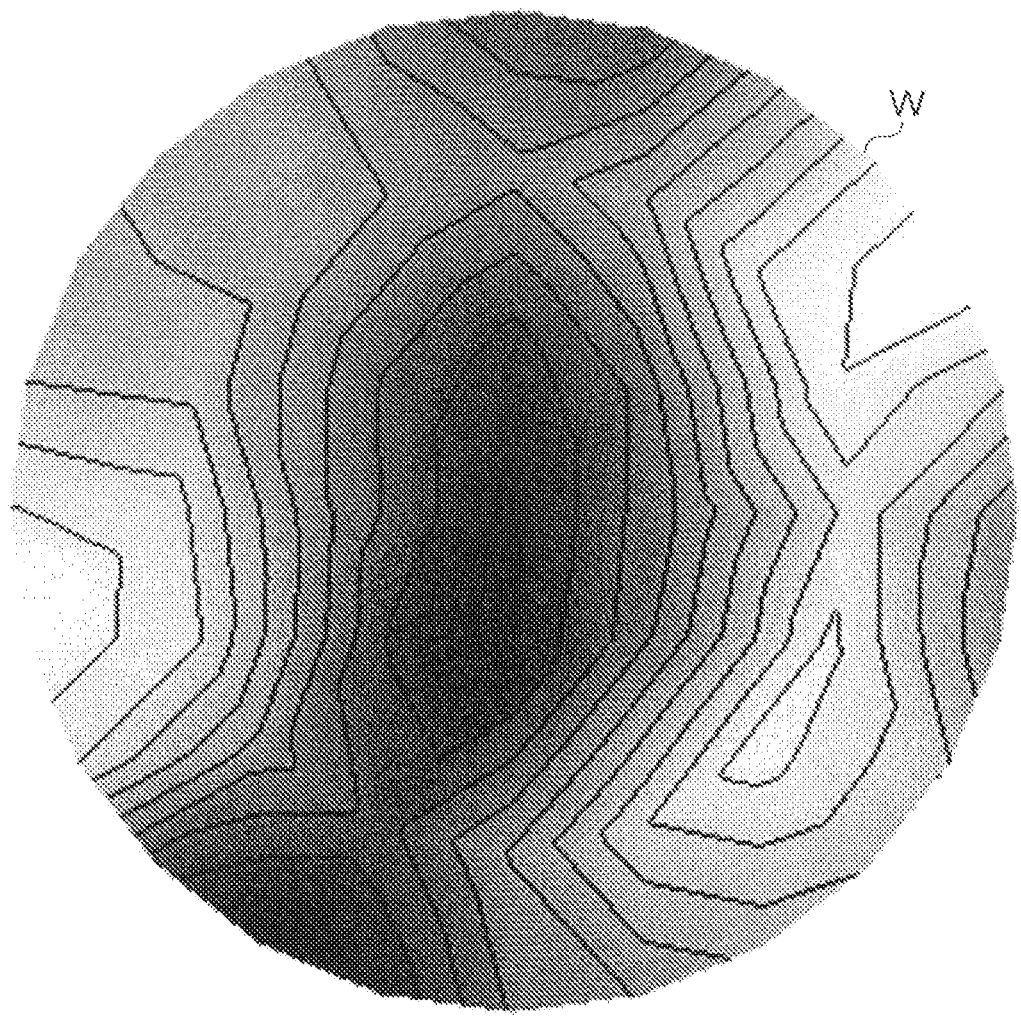
FIG. 3 is a view illustrating a film thickness distribution when film formation was actually performed using plasma processing in the case where convex portions were not formed on the dielectric window and the bottom surface of the dielectric window was flat.
Figure 3:
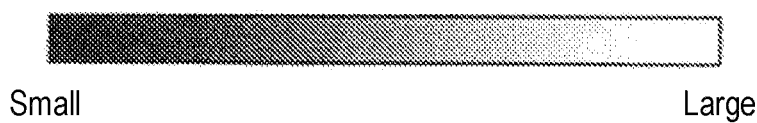
Figure 4A:
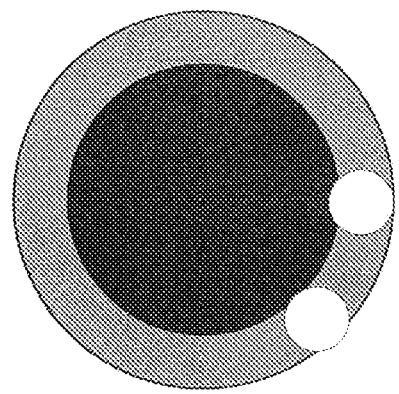
FIGS. 4A to 4F are views schematically illustrating the states inside a processing container when plasma was actually produced in a nitrogen atmosphere by changing plasma generation conditions in the case where no convex portion was formed on the dielectric window and the bottom surface of the dielectric window was flat.
Figure 4B:
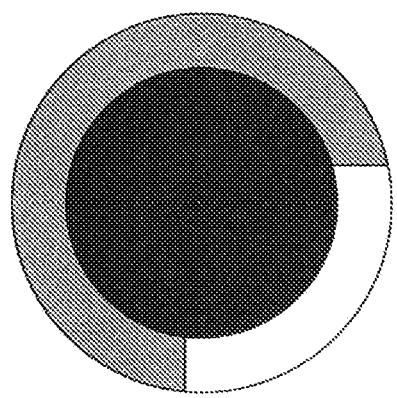
Figure 4C:
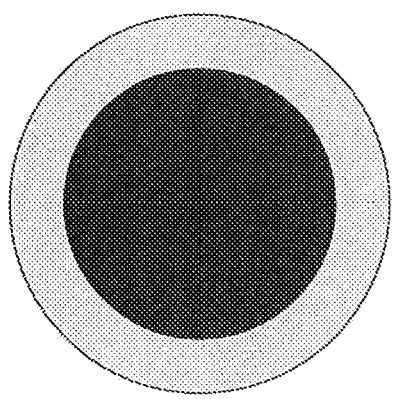
Figure 4D:
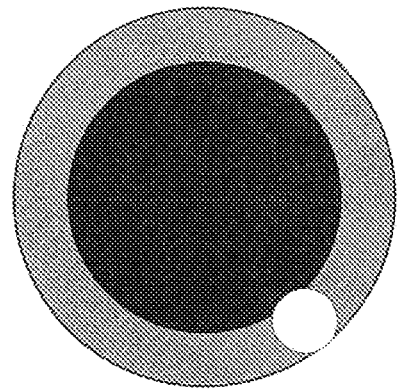
Figure 4E:
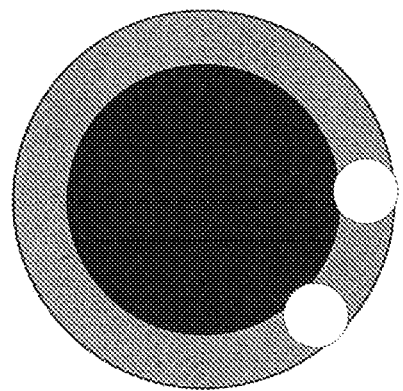
Figure 4F:
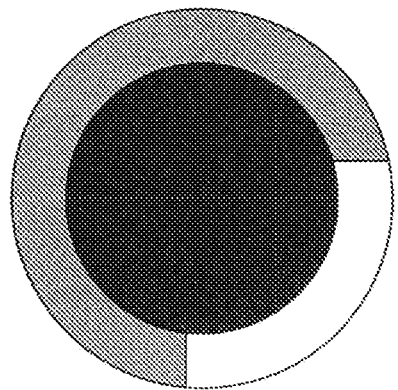

In the present embodiment, the dielectric window 14 is provided with convex portions 14a. FIG. 3 is a view illustrating a film thickness distribution when film formation was actually performed using plasma processing in the case where convex portions 14a were not formed on the dielectric window 14 and the bottom surface of the dielectric window 14 was flat, unlike the present embodiment. In FIG. 3, the darker the black color, the smaller the film thickness of the portion. FIGS. 4A to 4F are views schematically illustrating the states inside the processing container 10 when plasma was actually produced in a nitrogen atmosphere by changing plasma generation conditions in the case where convex portions 14a were not formed on the dielectric window 14 and the bottom surface of the dielectric window 14 was flat, unlike the present embodiment. In FIGS. 4A to 4F, the closer to white, the higher the intensity of the plasma. The output of the VHF waves and the pressure in the processing container 10 during plasma generation were 100 W and 500 mTorr in FIG. 4A, 200 W and 500 mTorr in FIG. 4B, and 500 W and 500 mTorr in FIG. 4C. In addition, the output of the VHF waves and the pressure were 100 W and 1000 mTorr in FIG. 4D, 200 W and 1000 mTorr in FIG. 4E, and 500 W and 1000 mTorr in FIG. 4F.

Unlike the present embodiment, when convex portions 14a were not formed on the dielectric window 14 and the bottom surface of the dielectric window 14 was flat, there were cases in which the thickness of the film obtained by plasma processing was not uniform in the circumferential direction, as illustrated in FIG. 3. Specifically, there were cases in which the difference between the maximum value and the minimum value in film thicknesses was about 5% or more of the average value of the film thicknesses. It is considered that this is because, depending on the plasma generation conditions, plasma having no bias in the circumferential direction (e.g., ring-shaped plasma) is not generated or plasma having bias in the circumferential direction is generated, as illustrated in FIGS. 4A to 4F.

In contrast, in the present embodiment, multiple convex portions 14a each having a width in the circumferential direction of ⅛ to ⅜ of the wavelength λ of VHF waves inside dielectric are provided on the bottom surface of the dielectric window 14. Therefore, electric fields generated by the VHF waves are concentrated on the convex portions 14a of the dielectric window 14 and the plasma processing space S immediately below the convex portions 14a regardless of plasma generation conditions. In the portions on which the electric fields are concentrated, the absorption efficiency of electromagnetic waves into plasma is high, and thus reflection waves from plasma are suppressed. Since the convex portions 14a for concentrating electric fields are arranged at regular intervals in the circumferential direction as described above, in the entire dielectric window 14, the electric field distribution for plasma generation immediately below the dielectric window 14 has no circumferential bias regardless of plasma generation conditions. Therefore, the circumferential bias of the plasma generated by these electric fields is suppressed. In addition, when film formation is performed as plasma processing using this plasma, it is possible to obtain a uniform film thickness in the circumferential direction. Even when plasma processing other than film formation is performed, it is possible to obtain uniform processing results in the circumferential direction.

In addition, in the present embodiment, VHF waves are used instead of microwaves. Therefore, it is possible to avoid disadvantages caused by using microwaves. For example, since it is possible to lower the height of the plasma processing space S compared with the case of using microwaves, it is possible to miniaturize the processing container 10 and thus to miniaturize the plasma processing apparatus 1. In addition, it is possible to use a metal shower head electrode, which does not generate an abnormal discharge even when radio-frequency waves are used.

In the figures used in the above description, the convex portions 14a are formed by protrusions integrally formed with the main body 14b, and the bottom surfaces of the convex portions 14a are located below the bottom surface of the main body 14b. Without being limited thereto, the convex portions 14a may be formed between the concave portions integrally formed with the main body 14b, and the bottom surfaces of the convex portions 14a and the bottom surface of the main body 14b may coincide with each other.

In the above description, it is assumed that the convex portions 14a of the dielectric window 14 are provided at regular intervals along the circumferential direction. However, the intervals at which the convex portions 14a are provided do not have to be exactly the same, as long as the electric fields in the plasma processing space S directly below the dielectric window 14 are not biased in the circumferential direction regardless of the plasma generation conditions.

In the present embodiment, the distance L3 between adjacent convex portions 14a is 1% or more of the wavelength λ of VHF waves inside dielectric. Therefore, the electric fields can be concentrated on each convex portion 14a and directly below each convex portion 14a. As a result, it is possible to more reliably obtain a distribution having no circumferential bias as an electric field distribution directly below the dielectric window 14.

In order to concentrate electric fields on the convex portions 14a, it is conceivable to set the radial width of the convex portions 14a to ⅛ to ⅜ of the wavelength λ of VHF waves inside dielectric. However, in order to avoid enlargement of the plasma processing apparatus 1, it is preferable to set the width of the convex portions 14a in the circumferential direction, not the width in the radial direction, to ⅛ to ⅜ of the wavelength λ of VHF waves inside dielectric.

In the example described above, the angle formed by the long sides of the rectangular shape of the convex portions 14a and the radial direction of the dielectric window 14 in the plan view is a right angle (90°). The width of the convex portions 14a in the circumferential direction means the length of the long sides of the rectangular shape. Without being limited thereto, the angle formed by the long sides of the rectangular shape of the convex portions 14a and the radial direction of the dielectric window 14 in a plan view may be 45° or more and less than 90°, or more than 90° and 135° or less. In this case, the width of the convex portions 14a in the circumferential direction may mean the length of the long sides of the rectangular shape, or may mean the length of the diagonal lines of the rectangular shape. In other words, in this case, when the length of the long sides or the diagonal lines of the rectangular shape of the convex portions 14a in the plan view is set to ⅛ to ⅜ of the wavelength λ of VHF waves inside dielectric, it is possible to obtain uniform plasma processing results in the circumferential direction.

In the example described, the shape of the convex portions 14a in a plan view is rectangular. Without being limited thereto, the shape of the convex portions 14a in a plan view may be an elliptical shape. In this case, the width of the convex portions 14a in the circumferential direction means, for example, the length in the major axis direction of the elliptical shape of the convex portions 14a in a plan view. That is, in this case, when the length of the elliptical shape of the convex portions 14a in the major axis direction in a plan view is set to ⅛ to ⅜ of the wavelength λ of VHF waves inside dielectric, it is possible to obtain uniform plasma processing results in the circumferential direction.

It should be understood that the embodiments disclosed herein are illustrative and are not limiting in all aspects. The above embodiments may be omitted, replaced, or modified in various forms without departing from the scope and spirit of the appended claims.

The following configurations also belong to the technical scope of the present disclosure.

(1) A plasma processing apparatus for processing a workpiece with plasma, the plasma processing apparatus including:

a stage configured to place thereon the workpiece;

a waveguide part configured to introduce plasma-generating electromagnetic waves in the VHF band into the plasma processing apparatus; and a dielectric window configured to transmit the electromagnetic waves introduced through the waveguide part to a plasma processing space formed on a workpiece placement side of the stage, wherein the dielectric window is an annular member disposed so as to face a plasma processing space side of the stage and includes multiple convex portions, which protrude toward the stage and are arranged on the stage side along a circumferential direction at regular intervals, and wherein the convex portions each has a circumferential width of ⅛ to ⅜ of the wavelength of the electromagnetic waves inside the dielectric window.

According to item (1), the annular dielectric window is provided with multiple convex portions each having a width in the circumferential direction of ⅛ to ⅜ of the wavelength of the electromagnetic waves in the VHF band. Therefore, regardless of the intensity of the electromagnetic waves or the pressure during plasma processing, the electromagnetic waves for plasma generation resonate in the convex portions, and electric fields are concentrated on the convex portions. In a portion on which electric fields are concentrated, the absorption efficiency of electromagnetic waves into plasma is high, and thus the reflection waves from plasma are suppressed. Since the convex portions are arranged at regular intervals in the circumferential direction, it is possible to make the plasma distribution in the plasma processing uniform.

(2) The plasma processing apparatus of item (1), wherein the distance between adjacent convex portions is 1% or more of the wavelength of the electromagnetic waves.

(3) The plasma processing apparatus of item (1) or (2), wherein the dielectric window is made of alumina, quartz, or aluminum nitride.

(4) The plasma processing apparatus of any one of items (1) to (3), wherein the dielectric window is an annular member having an outer diameter of 350 mm to 500 mm and an inner diameter of 300 mm to 450 mm.

(5) A plasma processing method for processing a workpiece with plasma using a plasma processing apparatus that includes:

a stage configured to place thereon the workpiece, and a dielectric window configured to transmit electromagnetic waves to a plasma processing space formed on a workpiece placement side of the stage, wherein the dielectric window is an annular member disposed so as to face a plasma processing space side of the stage and includes multiple convex portions, which protrude toward the stage and are arranged on the stage side along a circumferential direction, and wherein the convex portions each has a circumferential width of 1/8 to 3/8 of a wavelength of plasma-generating electromagnetic waves in a VHF band inside the dielectric window, the plasma processing method including:

a step of introducing the electromagnetic waves into the plasma processing apparatus; and a step of supplying the introduced electromagnetic waves to the plasma processing space through the dielectric window so as to generate plasma.

EXPLANATION OF REFERENCE NUMERALS

1: plasma processing apparatus, 10: processing container, 11: stage, 14: dielectric window, 14a: convex portion, L2: width in circumferential direction, S: plasma processing space

What is claimed is:

1. A plasma processing apparatus for processing a workpiece with plasma, the plasma processing apparatus comprising:
    a processing container;
    a stage configured to place thereon the workpiece in the processing container;
    a shower head electrode facing the stage;
    a very high frequency (VHF) generation source configured to output a VHF band;
    a waveguide part configured to introduce plasma-generating electromagnetic waves in the VHF band from the VHF generation source into the plasma processing apparatus; and
    a dielectric window configured to transmit the electromagnetic waves introduced through the waveguide part to a plasma processing space formed on a workpiece placement side of the stage,
    wherein the dielectric window is an annular member disposed so as to face a plasma processing space side of the stage and includes multiple convex portions, which protrude toward the stage and are arranged on the stage side along a circumferential direction at predetermined uniform intervals, and
    wherein the convex portions each has a circumferential width of 1/8 to 3/8 of a wavelength of the electromagnetic waves inside the dielectric window.

2. The plasma processing apparatus of claim 1, wherein a distance between adjacent convex portions is 1% or more of the wavelength of the electromagnetic waves.

3. The plasma processing apparatus of claim 2, wherein the dielectric window is made of alumina, quartz, or aluminum nitride.

4. The plasma processing apparatus of claim 3, wherein the dielectric window is an annular member having an outer diameter of 350 mm to 500 mm and an inner diameter of 300 mm to 450 mm.

5. The plasma processing apparatus of claim 1, wherein the dielectric window is made of alumina, quartz, or aluminum nitride.

6. The plasma processing apparatus of claim 1, wherein the dielectric window is an annular member having an outer diameter of 350 mm to 500 mm and an inner diameter of 300 mm to 450 mm.

7. A plasma processing method for processing a workpiece with plasma comprising:
    providing a plasma processing apparatus, the plasma processing apparatus including: a processing container; a stage configured to place thereon the workpiece in the processing container; a shower head electrode facing the stage; a very high frequency (VHF) generation source configured to output a VHF band; and a dielectric window configured to transmit electromagnetic waves to a plasma processing space formed on a workpiece placement side of the stage, wherein the dielectric window is an annular member disposed so as to face a plasma processing space side of the stage and includes multiple convex portions, which protrude toward the stage and are arranged on the stage side along a circumferential direction, and wherein the convex portions each has a circumferential width of 1/8 to 3/8 of a wavelength of plasma-generating electromagnetic waves in the VHF band inside the dielectric window;
    introducing the electromagnetic waves into the plasma processing apparatus; and
    supplying the introduced electromagnetic waves to the plasma processing space through the dielectric window so as to generate plasma.

* * * * *